United States Patent [19]

Suzuki

[11] 4,396,909
[45] Aug. 2, 1983

[54] FREQUENCY GENERATING CIRCUIT

[75] Inventor: Kazuyasu Suzuki, Kodaira, Japan

[73] Assignee: Casio Computer Co., Ltd., Tokyo, Japan

[21] Appl. No.: 268,062

[22] Filed: May 28, 1981

[30] Foreign Application Priority Data

Jun. 3, 1980 [JP] Japan .................. 55-76275[U]

[51] Int. Cl.³ .................. H03K 5/04; H03K 5/156
[52] U.S. Cl. .................. 340/384 E; 328/58; 328/61; 377/110; 377/114; 307/265
[58] Field of Search .................. 307/265, 273; 328/48, 328/58, 61, 37; 377/110, 114; 340/384 E

[56] References Cited

U.S. PATENT DOCUMENTS

| | | | |
|---|---|---|---|
| 3,258,696 | 6/1966 | Heymann | 328/37 |
| 3,995,268 | 11/1976 | Ferrari | 340/384 E |
| 4,001,716 | 1/1977 | Swanson et al. | 307/273 |
| 4,242,636 | 12/1980 | Gilmer et al. | 307/265 |
| 4,275,354 | 6/1981 | Suematsu et al. | 328/58 |
| 4,296,380 | 10/1981 | Minakuchi | 328/61 |

FOREIGN PATENT DOCUMENTS

| | | |
|---|---|---|
| 2429271 | 6/1974 | Fed. Rep. of Germany . |
| 2813156 | 9/1979 | Fed. Rep. of Germany . |
| 1370564 | 10/1974 | United Kingdom . |
| 2000886A | 1/1979 | United Kingdom . |
| 2017366 | 10/1979 | United Kingdom . |
| 2038520A | 7/1980 | United Kingdom . |

Primary Examiner—John S. Heyman
Attorney, Agent, or Firm—Frishauf, Holtz, Goodman & Woodward

[57] ABSTRACT

A frequency generating circuit comprises a piezoelectric buzzer (18) which is driven by a driving signal having a desired frequency and a desired pulse width; a frequency dividing circuit (1) made up of a multi-stage flip-flop array for frequency dividing a reference frequency signal; logic setting means ($3_1$ to $3_6$, 4) which is responsive to a plurality of externally generated setting signals ($C_1$ to $C_6$) to effect a logic setting for obtaining the desired frequency; control means (5, 6, 7, 10, 11, 12) for outputting a control signal to reset terminals of the flip-flops on the basis of an output signal of the logic setting means for resetting the frequency dividing circuit to obtain the desired frequency; pulse width setting means (15) coupled to output terminals of at least two predetermined flip-flop stages of the frequency dividing circuit to set the pulse width of a driving signal to the desired pulse width; and driving signal generating means (8, 13, 14, 16) for delivering a driving signal to the piezoelectric buzzer (18) as a function of the control signal of the control means and the output signal of the pulse width setting means, the driving signal having the desired frequency and the desired pulse width.

12 Claims, 3 Drawing Figures

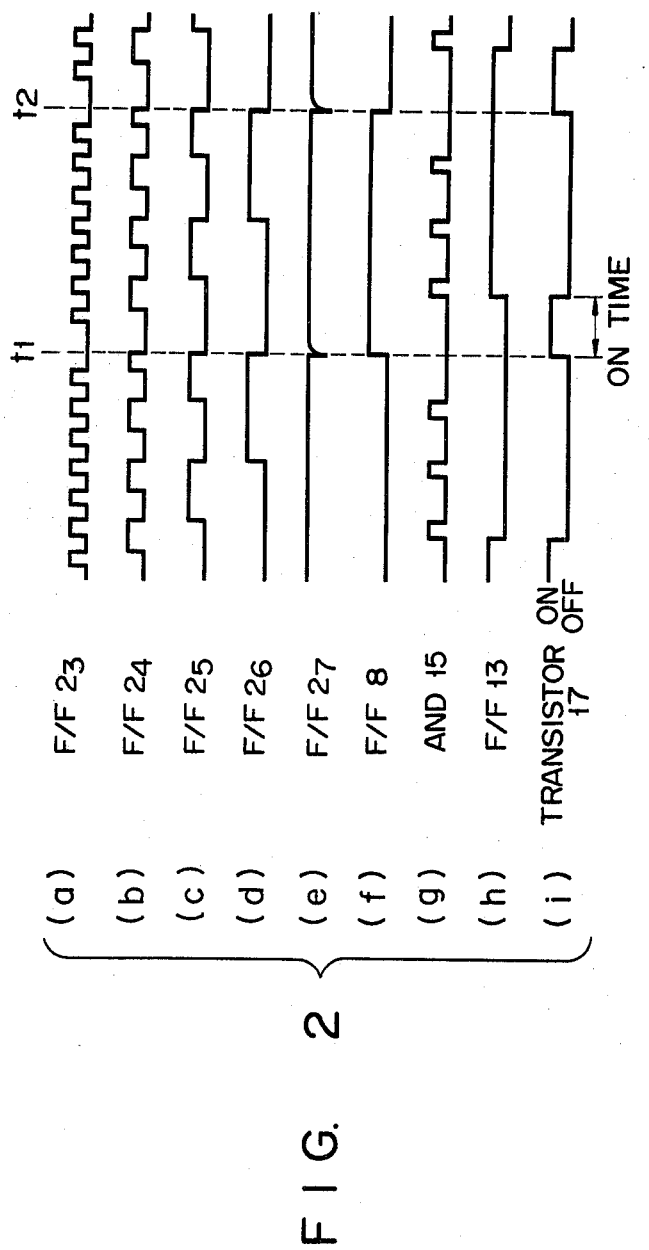

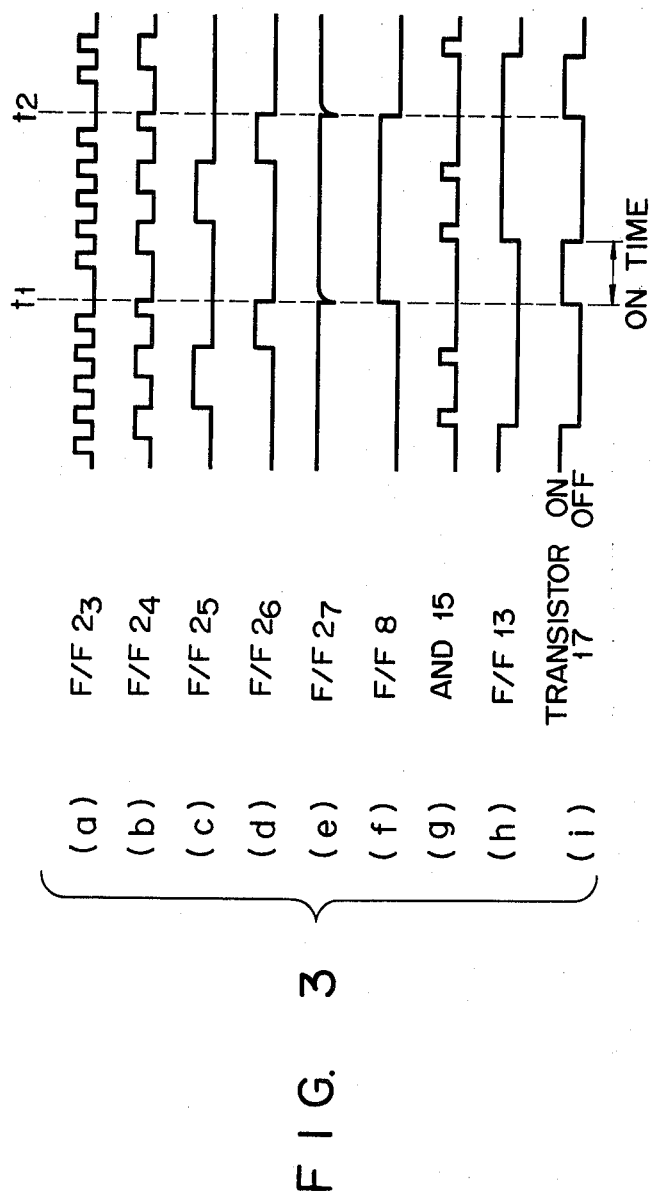

FREQUENCY GENERATING CIRCUIT

BACKGROUND OF THE INVENTION

This invention relates to improvements in frequency generating circuits and, more particularly, to frequency generating circuits for generating piezoelectric buzzer drive signals.

Recently, there have been proposed electronic table calculators, electronic clocks and other small size electronic devices, in which musical tones such as C, D, E, F, ... are generaged in correspondence to the operation of keys or a predetermined piece of music is produced as an alarm sound. The musical tones are usually produced by using a piezoelectric buzzer, and a given tone can be obtained by varying the drive frequency. Hitherto, it has been usual to use a rectangular wave signal with a duty ratio of one half for driving the piezoelectric buzzer. With the variation of the drive frequency for obtaining various tones, the duration of the drive signal is changed to change the period during which a piezoelectric buzzer drive transistor is held "on", i.e., the "on"-time of the transistor. Meanwhile, it is experimentally known that with a piezoelectric buzzer a maximum (or constant) sound pressure can be obtained irrespective of the drive frequency provided if the pulse width is sufficient to obtain the saturation of a coil. Therefore, where a piezoelectric buzzer is driven by using a conventional signal with a duty ratio of one half, the time length of the "on"-time is considerably long compared to the saturation period of the piezoelectric buzzer, thus leading to the reduction of resolution and wasteful power consumption.

An object of the invention is to provide a frequency generating circuit, which can overcome the drawbacks mentioned above and with which the "on"-time of the piezoelectric buzzer drive transistor can be held constant irrespective of the drive frequency, thus permitting the reduction of power consumption without reducing the sound pressure and also permitting improvement of the resolution.

SUMMARY OF THE INVENTION

To achieve the above object, the frequency generating circuit according to the invention comprises a frequency dividing circuit for dividing a reference frequency, a logic setting circuit for providing logic settings for corresponding predetermined output stages of the frequency dividing circuit, a converting circuit receiving the outputs of predetermined output stages of the frequency dividing circuit and outputs of the logic setting circuit for converting the outputs of predetermined output stages, a detecting circuit for providing a detection signal when a predetermined value is reached by the output of the converting circuit, and a circuit for obtaining a signal having a constant duration from the detection signal.

With this construction according to the invention, it is possible to vary the drive frequency by appropriately specifying the duty ratio with setting signals and maintain the "on"-time of the piezoelectric buzzer drive transistor constant irrespective of the drive frequency. Thus, it is possible to obtain a frequency generating circuit, with which the "on"-time of the piezoelectric buzzer drive transistor can be set equal to the period till the saturation of the buzzer, thus permitting the reduction of power consumption without reduction of the sound pressure and providing an improvement of the resolution.

This invention can be more fully understood from the following detailed description when taken in conjunction with the accompanying drawings.

BRIEF DESCRIPTION OF THE DRAWING

FIGS. 2a to 2i show a time chart illustrating the operation of various parts of the circuit of FIG. 1 under a certain preset condition; and FIGS. 3a to 3i show a time chart illustrating the operation of various parts of the circuit of FIG. 1 under a different preset condition.

DETAILED DESCRIPTION

Figure 1:
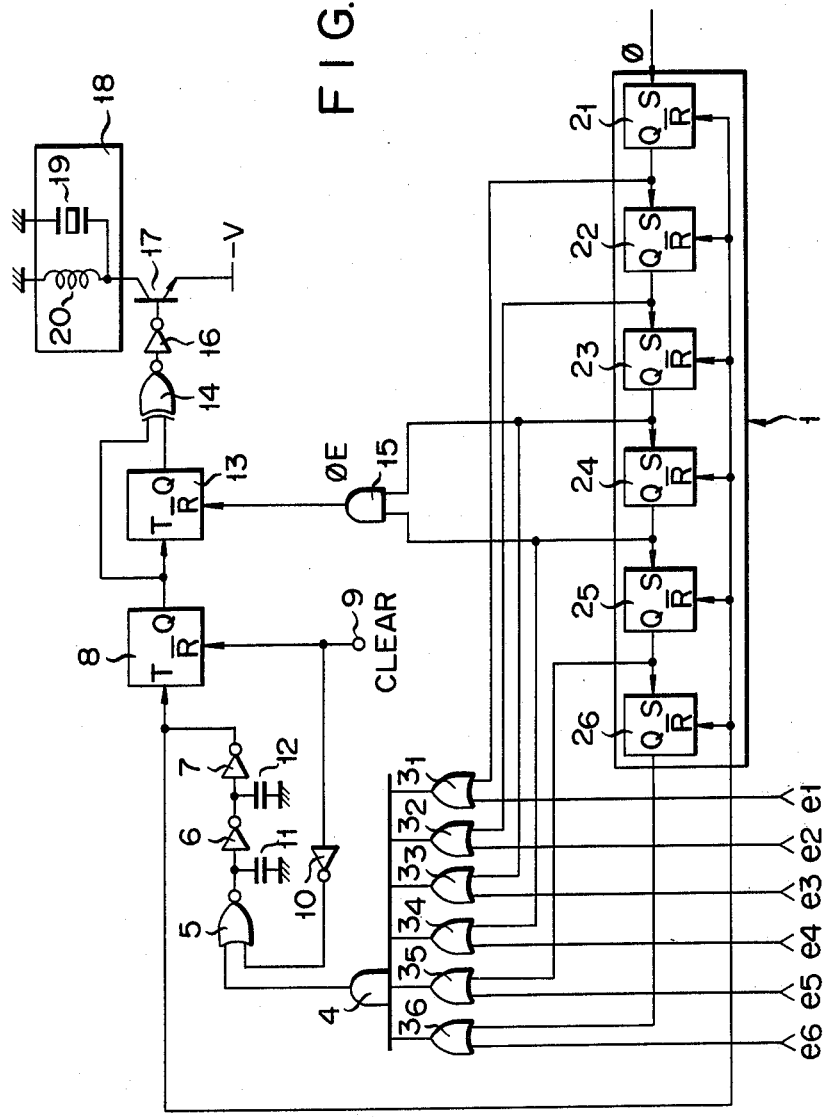
FIG. 1 is a block circuit diagram showing an embodiment of the invention.

Referring now to FIG. 1, designated at 1 is a frequency dividing circuit which divides the frequency of a reference signal $\phi$ and is formed by, for instance, first to sixth flip-flops $2_1$ to $2_6$. The output signals of the flip-flops $2_1$ to $2_6$ are coupled through respective OR gates $3_1$ to $3_6$ to an AND gate 4. To the AND gate 4 are also supplied frequency setting signals $e_1$ to $e_6$ through the respective OR gates $3_1$ to $3_6$. The output of the AND gate 4 is coupled through a NOR gate 5 and inverters 6 and 7 to a trigger terminal T of a trigger flip-flop 8 and also to a reset terminal R of each of the flip-flops $2_1$ to $2_6$. Designated at 9 is a terminal, to which a clear signal provided by operating a key is supplied. The clear signal supplied to the terminal 9 is coupled to the flip-flop 8 and is also coupled through an inverter 10 to the NOR gate 5. Capacitors 11 and 12 are provided between the output terminals of the NOR gate 5 and inverter 6 on one hand and ground on the other hand. The output of the flip-flop 13 is coupled to a D-type flip-flop 13 and also to an exclusive NOR circuit (hereinafter referred to as EX NOR circuit) 14. The flip-flop 13 reads out the input signal in synchronism with a signal $\phi E$ taken out from the output terminals of the flip-flops $2_3$ and $2_4$, for instance, through an AND gate 15, and its output signal is coupled to the EX NOR circuit 14. The output of the EX NOR circuit 14 is coupled through an inverter 16 to the base of a buzzer drive transistor 17, which has its emitter connected to a $-V$ voltage supply terminal and its collector connected through a piezoelectric buzzer 18 to ground. The piezoelectric buzzer 18 is equivalently shown to be formed by an oscillator 19 and a coil 20 connected in parallel.

Now, the operation of the circuit having the construction described above will be described. The preset signals e1 to e6 can be given respective values according to a desired frequency, and operation in a case when the signals e1 to e6 are given respective values "1", "1", "0", "0", "0", "0" will be described with reference to the timing chart of FIG. 2. The reference signal $\phi$ which is supplied to the frequency divider 1 is progressively divided through the flip-flops $2_1$ to $2_6$, and the waveforms of the outputs of the third to sixth flip-flops $2_3$ to $2_6$ are respectively shown in FIGS. 2a to 2d. When the signals from the output terminals of the third to sixth flip-flops $2_3$ to $2_6$ are all "1", the logic condition of the AND gate 4 is satisfied, so that a signal of "1" (i.e., ground level) is provided from the AND gate 4. More particularly, with the signals e1 to e6 given with the respective values "1", "1", "0", "0", "0", "0" as mentioned above, the OR gates $3_1$ and $3_2$ always provide a signal of "1" irrespective of the output state of the flip-flops $2_1$ and $2_2$, and thus when the outputs of the flip-flops $2_3$ to $2_6$ are all "1", the outputs of the OR gates $3_1$ to $3_6$ are all "1" to satisfy the logic condition of the AND gate 4. The output of the AND gate 4 is coupled to the NOR gate 5. Meanwhile, the clear signal input terminal 9 is always held at the ground level, i.e., in the "1" signal state, so that the inverter 10 is providing output of "0" (i.e., $-V$) to the NOR gate 5. Thus, when the AND gate 4 provides the signal of "1" as mentioned, the NOR gate 5 provides output of "0", which is coupled through the inverters 6 and 7 to obtain a signal as shown in FIG. 2e. With this output of the inverter 7 the flip-flop 8 is set as shown in FIG. 2f to reset the flip-flops $2_1$ to $2_6$ in the frequency dividing circuit 1. As a result, the output of the AND gate 4 is changed to "0" to change the output of the AND gate 4 to "1" and the output of the inverter 7 to "1" as shown in FIG. 2e. The set output of the flip-flop 8 is also coupled to the EX NOR circuit 14. Since at this time the flip-flop 13 is in the reset state and providing a signal of "0", with the signal of "1" provided from the flip-flop 8, the output of the EX NOR circuit 14 is changed to "1". The output of the EX NOR circuit 14 is coupled through the inverter 16 to the base of the transistor 17. As a result, the transistor 17 is turned on as shown in FIG. 2i to drive the piezoelectric buzzer 18. Also, with the signal of "1" provided from the flip-flop 8, at a subsequent instant when a pulse signal $\phi E$ is provided from the AND gate 15 as shown in FIG. 2g, the output of the flip-flop 8 is read into the flip-flop 13 to cause the flip-flop 13 to provide a signal of "1" as shown in FIG. 2h. As a result, the output of the EX NOR circuit 14 is changed from "1" to "0", thus turning off the transistor 17. In this state, when the outputs of the flip-flops $2_3$ to $2_6$ all become "1" at an instant t2 in FIG. 2, the logic condition of the AND gate 4 is satisfied, so that a signal of "1" is provided from the AND gate 4. This output of the AND gate 4 is coupled through the NOR gate 5 and inverters 6 and 7 to the flip-flop 8 and frequency dividing circuit 1, thus resetting the flip-flop 8 and also resetting the flip-flops $2_1$ to $2_6$. With the flip-flop 8 reset so that its output is changed to "0", the logic condition of the EX NOR circuit 14 is satisfied, so that a signal of "1" is provided from the EX NOR circuit 14 to turn on the transistor 17 so as to drive the piezoelectric buzzer 18. When the flip-flops $2_3$ and $2_4$ of the frequency divider 1 subsequently provide an output of "1", the output of the AND gate 15 is changed to "0", so that the output "0" of the flip-flop 8 is read into the flip-flop 13. As a result, the output of the flip-flop 13 is changed to "0" to change the output of the EX NOR gate 14 to "0" so as to turn off the transistor 17 again. The above sequence of operations is repeated, whereby the piezoelectric buzzer 18 is driven by the transistor 17 at a constant frequency. More particularly, the frequency divider 1 is reset when the flip-flop 8 is set or reset in synchronism to the output of the AND gate 4, and the piezoelectric buzzer 18 is driven by the transistor 17, which is held "on" from the instant of resetting of the frequency divider 1 till the instant when the outputs of the flip-flops $2_3$ and $2_4$ in the frequency divider 1 both become "1". The cycle period with which the transistor 17 is repeatedly turned on is determined by the values of the signals e1 to e6, and in the above case where the signals e1 to e6 are given the respective values "1", "1", "0", "0", "0", "0", the period until the outputs of the flip-flops $2_3$ to $2_6$ all become "1" constitutes one cycle, and in this case the duty ratio is one-fourth.

In case when the signals e1 to e6 are given the respective values of "1", "1", "0", "0", "1", "0", a buzzer drive signal with a duty ratio of ⅛ can be obtained, and the operation in this case will now be described with reference to FIG. 3. Shown in FIGS. 3a to 3i are waveforms of signals from the same parts as for the signals shown in FIGS. 2a to 2i. With the signals e1 to e6 given the respective values "1", "1", "0", "0", "1", "0", the outputs of the OR gates $3_1$, $3_2$ and $3_5$ are always "1". Thus, when the flip-flops $2_3$ and $2_4$ in the frequency divider 1 are set by the operation of counting the reference pulses $\phi$ after the flip-flop $2_6$ is set as shown in FIGS. 3a to 3d, i.e., at an instant t1, the outputs of the OR gates $3_1$ to $3_6$ all become "1", thus causing a signal of "1" to be provided from the AND gate 4. Subsequently, every time when the same condition as that as the instant t1 is satisfied such as an instant t2, a signal "1" is provided from the AND gate 4. The flip-flop 8 is repeatedly set and reset while the frequency divider 1 is reset in synchronism with the output signal from the AND gate 4 as mentioned earlier. During the period from the instant of setting or resetting of the flip-flop 8 till the content of the flip-flop 8 is read into the flip-flop 13 according to the output of the AND gate 15, the output of the EX NOR circuit 14 becomes "1", the transistor 17 is held "on" to drive the piezoelectric buzzer 18. It will be seen that the period of triggering the flip-flop 8, i.e., the period of the on-off control of the transistor 17, can be changed by changing the values of the signals e1 to e6 as mentioned previously. However, since the timing of reading the content of the flip-flop 8 in the flip-flop 13 is synchronized with the output of the AND gate 15 which detects the reaching of a predetermined value by the content of the frequency divider 1, the period during which the output of the EX NOR circuit 14 is "1" is constant irrespective of the values of the signals e1 to e6.

What is claimed is:

1. A frequency generating circuit comprising:
  a piezoelectric buzzer which is driven by a driving signal having a desired frequency and a desired pulse width;
  a frequency dividing circuit comprised of a multistage flip-flop array for frequency dividing a reference frequency signal, said flip-flop stages of said frequency dividing circuit having reset terminals and output terminals;
  logic setting means coupled to said frequency dividing circuit and including means responsive to a plurality of externally generated setting signals to effect a logic setting for obtaining said desired frequency;
  control means coupled to an output of said logic setting means and to said reset terminals of said frequency dividing circuit for outputting a control signal to said reset terminals on the basis of an output signal of said logic setting means, said frequency dividing circuit being reset by said control signal applied to said reset terminals to obtain said desired frequency;
  pulse width setting means coupled to said output terminals of at least two predetermined flip-flop stages of said frequency dividing circuit to set the pulse width of a driving signal to said desired pulse width; and
  driving signal generating means coupled to said control means and to said pulse width setting means for delivering a driving signal to said piezoelectric buzzer as a function of said control signal of said control means and the output signal of said pulse width setting means, said driving signal having said desired frequency and said desired pulse width.

2. The frequency generating circuit of claim 1, wherein:
said logic setting means comprises a plurality of OR gates and one AND gate coupled to the outputs of said OR gates, the number of said OR gates corresponding to the number of said flip-flop stages of said frequency dividing circuit, and outputs of said flip-flop stages being respectively coupled to one of said OR gates;
an output signal of the respective stage flip-flops of said frequency dividing circuit and the respective externally generated setting signals being ORed by a respective OR gate, the output signals of the respective OR gates being ANDed by said one AND gate.

3. The frequency generating circuit of claim 1, wherein:
said control means comprises a NOR gate, a first inverter, a second inverter, a first capacitor and a second capacitor;
an input of said NOR gate being coupled to said output of said logic setting means, the output of said NOR gate being coupled to the input of said first inverter, said first capacitor being coupled between the output of said NOR gate and ground potential, the output of said first inverter being coupled to the input of said second inverter, said second capacitor being coupled between the output of said first inverter and ground potential, and the output of said second inverter being coupled to supply said control signal to said driving signal generating means and to said reset terminals of said frequency dividing circuit.

4. The frequency generating circuit of claim 2, wherein:
said control means comprises a NOR gate, a first inverter, a second inverter, a first capacitor and a second capacitor;
an input of said NOR gate being coupled to said output of said one AND gate of said logic setting means, the output of said NOR gate being coupled to the input of said first inverter, said first capacitor being coupled between the output of said NOR gate and said ground potential, the output of said first inverter being coupled to the input of said second inverter, said second capacitor being coupled between the output of said first inverter and ground potential, and the output of said second inverter being coupled to supply said control signal to said driving signal generating means and to said reset terminals of said frequency dividing circuit.

5. The frequency generating circuit of claim 1, wherein:
said driving signal generating means includes a first flip-flop, a second flip-flop coupled to an output of said first flip-flop, and a comparison circuit coupled to an output of both said first and second flip-flops;
said first flip-flop being coupled to receive said output signal of said control means so as to be set or reset by said output signal of said control means; and
an output signal of said first flip-flop being coupled directly to said comparison circuit, and an output of said first flip-flop being coupled to said comparison circuit through said second flip-flop subjected to a read-in control by an output signal of said pulse width setting means, said comparison circuit comparing the output signals of said first and second flip-flops with each other, the output of said comparison circuit corresponding to said driving signal.

6. The frequency generating circuit of claim 5, wherein said driving signal generating means comprises means responsive to the output of said comparison circuit for supplying said driving signal to said piezoelectric buzzer.

7. The frequency generating circuit of claim 2, wherein:
said driving signal generating means includes a first flip-flop, a second flip-flop coupled to an output of said first flip-flop, and a comparison circuit coupled to an output of both said first and second flip-flops;
said first flip-flop being coupled to receive said output signal of said control means so as to be set or reset by said output signal of said control means; and
an output signal of said first flip-flop being coupled directly to said comparison circuit, and an output of said first flip-flop being coupled to said comparison circuit through said second flip-flop subjected to a read-in control by an output signal of said pulse width setting means, said comparison circuit comparing the output signals of said first and second flip-flops with each other, the output of said comparison circuit corresponding to said driving signal.

8. The frequency generating circuit of claim 7, wherein said driving signal generating means comprises means responsive to the output of said comparison circuit for supplying said driving signal to said piezoelectric buzzer.

9. The frequency generating circuit of claim 3, wherein:
said driving signal generating means includes a first flip-flop, a second flip-flop coupled to an output of said first flip-flop, and a comparison circuit coupled to an output of both said first and second flip-flops;
said first flip-flop being coupled to receive said output signal of said control means so as to be set or reset by said output signal of said control means; and
an output signal of said first flip-flop being coupled directly to said comparison circuit, and an output of said first flip-flop being coupled to said comparison circuit through said second flip-flop subjected to a read-in control by an output signal of said pulse width setting means, said comparison circuit comparing the output signals of said first and second flip-flops with each other, the output of said comparison circuit corresponding to said driving signal.

10. The frequency generating circuit of claim 9, wherein said driving signal generating means comprises means responsive to the output of said comparison circuit for supplying said driving signal to said piezoelectric buzzer.

11. The frequency generating circuit of claim 4, wherein:
said driving signal generating means includes a first flip-flop, a second flip-flop coupled to an output of said first flip-flop, and a comparison circuit coupled to an output of both said first and second flip-flops;

said first flip-flop being coupled to receive said output signal of said control means so as to be set or reset by said output signal of said control means; and an output signal of said first flip-flop being coupled directly to said comparison circuit, and an output of said first flip-flop being coupled to said comparison circuit through said second flip-flop subjected to a read-in control by an output signal of said pulse width setting means, said comparison circuit comparing the output signals of said first and second flip-flops with each other, the output of said comparison circuit corresponding to said driving signal.

12. The frequency generating circuit of claim 11, wherein said driving signal generating means comprises means responsive to the output of said comparison circuit for supplying said driving signal to said piezoelectric buzzer.

* * * * *